(12) United States Patent
Yamanaka et al.

(10) Patent No.: US 6,207,986 B1
(45) Date of Patent: Mar. 27, 2001

(54) SEMICONDUCTOR INTEGRATED CIRCUIT DEVICE

(75) Inventors: Toshiaki Yamanaka, Iruma; Shin'ichiro Kimura, Kunitachi; Hideyuki Matsuoka, Hoya; Takeshi Sakata, Kodaira; Tomonori Sekiguchi, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/383,367

(22) Filed: Aug. 26, 1999

(30) Foreign Application Priority Data

Aug. 26, 1998 (JP) .................................................. 10-239898

(51) Int. Cl.[7] .................................................. H01L 27/10
(52) U.S. Cl. .................................... 257/296; 257/776
(58) Field of Search ................................ 257/296, 774, 257/776

(56) References Cited

U.S. PATENT DOCUMENTS

| | | | | |
|---|---|---|---|---|
| 5,119,155 | * | 6/1992 | Hieda et al. | 357/23.6 |
| 5,428,231 | * | 6/1995 | Tanaka et al. | 257/232 |
| 5,502,326 | * | 3/1996 | Slotboom et al. | 257/530 |
| 5,932,901 | * | 8/1999 | Itabashi et al. | 257/211 |
| 5,945,707 | * | 8/1999 | Bronner et al. | 257/330 |

OTHER PUBLICATIONS

Levenson et al., "Improving Resolution in Photolithography with a Phase–Shifting Mask", IEEE Trans. Electron Devices, vol. ED–29, No. 12, pp. 1828–1836, 1982.

* cited by examiner

Primary Examiner—Nathan Flynn
Assistant Examiner—Remmon R. Forde'
(74) Attorney, Agent, or Firm—Antonelli, Terry, Stout & Kraus, LLP

(57) ABSTRACT

A semiconductor integrated circuit device offering a phase pattern makeup that excludes mixture of insular and linear patterns in a mask for forming a single wire electrode layer so as to eliminate inconsistency in the Levenson arrangement of phase shifters. A plurality of wire electrodes are spaced a minimum size apart and are in different phases. Between two adjacent wire electrodes are plug electrodes each formed with an upper and a lower layer plug electrode in direct contact, with no intervention of wire electrodes and without the presence of an insular pattern made of the same wire electrode layer. This setup allows the Levenson arrangement to take shape for enhanced pattern density, whereby a semiconductor integrated circuit device of a high degree of integration is implemented.

12 Claims, 16 Drawing Sheets

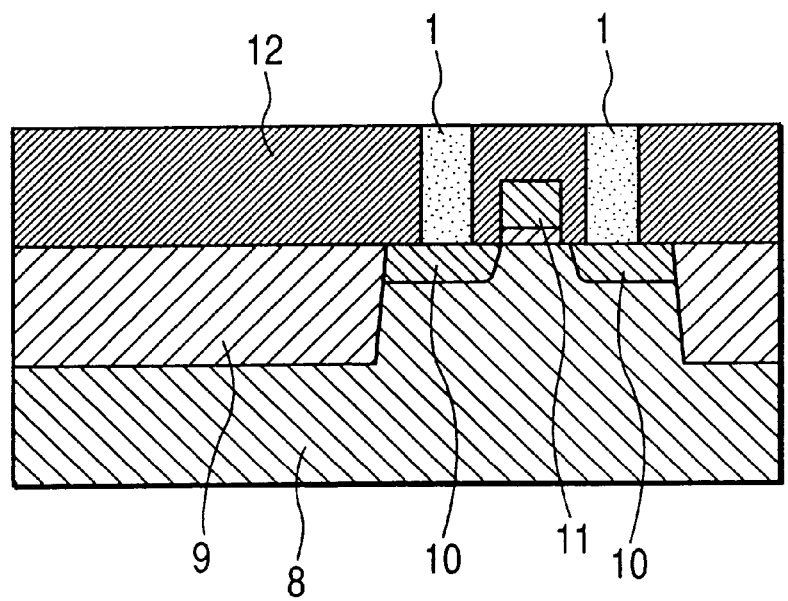
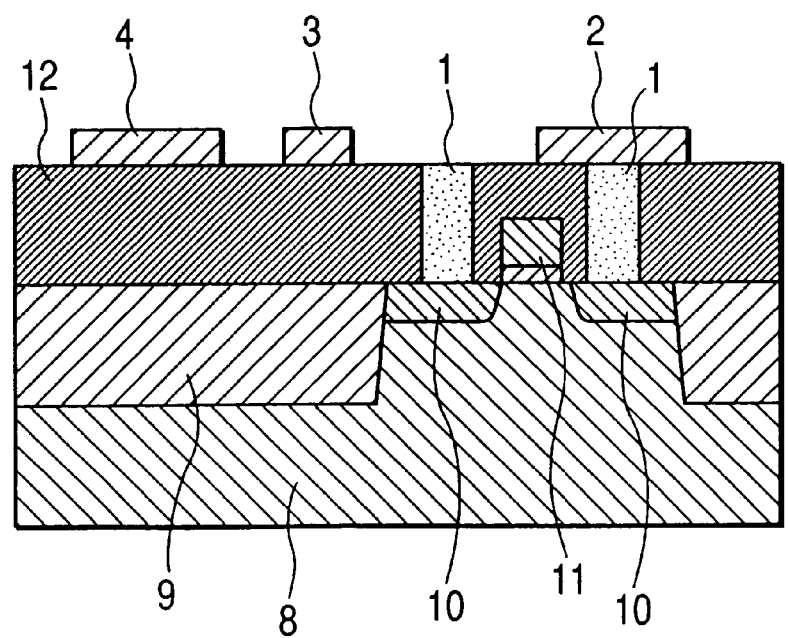

SEMICONDUCTOR INTEGRATED CIRCUIT DEVICE

BACKGROUND OF THE INVENTION

(1) Field of the Invention

The present invention relates to a semiconductor integrated circuit device whose patterns are formed using a phase-shifting mask. More particularly, the invention relates to a semiconductor integrated circuit device having electrode wires arranged to achieve a high degree of integration.

(2) Description of the Prior Art

One way of forming integrated circuit (IC) patterns using a phase-shifting mask involves locating phase shifters in apertures of a photomask to ensure that transmitted exposure light beams are 180 degrees out of phase between adjacent patterns whereby fine line patterns of high resolution are formed (known as the Levenson arrangement). The theory of pattern formation based on the Levenson arrangement is described in IEEE Transactions on Electron Devices, ED-29, pp. 1828–1836, 1982. This technique has made possible the formation of patterns with their fine lines made narrower than the wavelength of exposure light.

Next, a conventional example using the technique above is described in detail below with reference to FIGS. 3 and 4.

FIG. 3 is a plan view of wire electrodes in a conventional semiconductor integrated circuit device. In FIG. 3, wire electrodes 202, 203, 204 and 208 are part of first-layer IC elements including MOSFETs formed on a semiconductor substrate. The wire electrodes 204 and 208 are formed using a zero-phase pattern ($\phi=0$) while the wire electrodes 202 and 203 are formed using a $\pi$-phase pattern ($\phi=\pi$). The distances between the wires are minimized according to the principle of phase-shifting mask exposure.

FIG. 4 is a cross-sectional view taken on line Y1–Y1' in FIG. 3. As shown in FIG. 4, a silicon substrate 200 carries on it MOSFETs including a gate oxide film 231, gate electrodes 211, high-density impurity regions 210 (source and drain regions), and an isolation oxide film 209.

On the MOSFETS are a first interlayer insulating film 212, first-layer wire electrodes 202, 203, 204 and 208; a second interlayer insulating film 213, and a second-layer wire electrode 206 stacked one upon another. The high-density impurity regions 210 and first-layer wire electrodes 202 and 208 are interconnected by plug electrodes 201 each penetrating through the interlayer insulating film 212; the first-layer wire electrode 208 and second-layer wire electrode 206 are interconnected by plug electrodes 205 each penetrating through the interlayer insulating film 213.

SUMMARY OF THE INVENTION

In the above-described conventional example, the first-layer wire electrodes 203 and 204 along line Y2–Y2' in FIG. 3 are arranged to have a 180-degree phase difference therebetween, which ensures a minimum size "a" between the wires. On the other hand, the wire electrodes 202 and 203 have a zero-phase difference between them. Because the phase-shifting principle does not apply to the zero-phase difference, a fine line pattern of high resolution cannot be formed in the latter case. This requires making a distance "b" between the electrodes 202 and 203 greater than the minimum size "a."

In the inventors' experiments using a krypton fluoride excimer laser (KrF light source), the minimum size "a" measured about 0.16 μm while the wire-to-wire distance "b" turned out to be as wide as 0.25 μm. The reason is as follows: the wire electrode 208 is formed in an insular pattern as shown in FIG. 3, whereas the wire electrodes 202 and 203 extending in the X direction are in a phase-shifting mask to ensure a 180-degree phase difference between adjacent patterns along the Y1–Y1' line. In this setup, an inconsistency occurs in the Levenson arrangement of phase shifters wherein the insular wire electrode 208 is absent along the Y2–Y2' line in FIG. 3. A similar inconsistency is also observed between the insular electrodes 208, requiring that the distance "b" therebetween be made greater than the minimum size "a" as illustrated in FIG. 3.

As described, the patterns used for semiconductor integrated circuit devices are not necessarily applicable to the phase arrangement of 0, π, 0, π, etc., in keeping with the phase-shifting principle.

It is therefore a general object of the present invention to provide a semiconductor integrated circuit device to which the phase-shifting principle applies without inconsistency. It is a more specific object of the present invention to provide a semiconductor integrated circuit device offering a phase pattern makeup that excludes mixture of insular and linear patterns as shown in FIGS. 3 and 4 so as to eliminate inconsistency in the Levenson arrangement of phase shifters.

In carrying out the invention and according to one aspect thereof, there is provided a semiconductor integrated circuit device comprising: a first insulating film; a first conductor penetrating through the first insulating film; first and second wire electrodes patterned on the first insulating film in the same step using a phase-shifting mask; a second insulating film on the first and the second wire electrodes; and a second conductor penetrating through the second insulating film; wherein the first conductor electrically connects at least either the first or the second wire electrodes to either circuit elements or circuit wires located under the first insulating film; wherein the second conductor electrically connects either the first or the second wire electrodes to either circuit elements or circuit wires located on the second insulating film; and wherein, between adjacent first and second wire electrodes, a conductor formed with the first and the second conductor in direct contact is spaced from at least one of the adjacent first and second wire electrodes by a distance less than a minimum distance between the first and the second wire electrodes. What characterizes this structure is that between the linear wire electrode patterns are the first and the second conductor without the presence of an insular wire electrode pattern, i.e., that plug electrodes on and under the wire electrode layer are directly interconnected without the intervention of insular wire electrodes. Where a photomask is fabricated using linear patterns and with no insular pattern, the so-called Levenson arrangement is made possible to which the phase-shifting principle applies with no inconsistency. This enhances the pattern density of a semiconductor integrated circuit device and thus boosts its degree of circuit integration.

In a preferred structure according to the invention, apertures penetrating through the first insulating film constituting the first conductor may each be greater in diameter than apertures penetrating through the second insulating film constituting the second conductor.

In another preferred structure according to the invention, apertures penetrating through the first and the second insulating film constituting the first and the second conductor may be tapered in shape, upper portions of the apertures being made progressively wider than lower portions thereof.

In a further preferred structure according to the invention, the adjacent first and second wire electrodes may be electrically connected to a data line pair of a dynamic RAM.

In an even further preferred structure according to the invention, the adjacent first and second wire electrodes may be patterned using mask patterns having opposite phases; wherein the conductor formed with the first and the second conductor in direct contact may electrically connect either the circuit elements or the circuit wires located under the first insulating film, to either the circuit elements or the circuit wires located on the second insulating film.

In a still further preferred structure according to the invention, the adjacent first and second wire electrodes maybe electrically connected to a data line pair of a dynamic RAM.

In a yet further preferred structure according to the invention, the adjacent first and second wire electrodes may be patterned using mask patterns in phase with each other; wherein one end of the conductor made with the first and the second conductor in direct contact may be connected to a drain diffusion layer of a field effect transistor under the first insulating film and the other end of the conductor may be connected to a drain wire electrode on the second insulating film; and wherein one of the adjacent first and second wire electrodes may be a source wire electrode of the field effect transistor and the other one of the adjacent first and second wire electrodes may be a wire electrode of another field effect transistor adjacent to the field effect transistor. This structure is particularly conducive to reducing the spacing between wire electrodes for supplying power to source and drain regions of field effect transistors.

The foregoing and other objects, advantages, manners of operation and novel features of the present invention will be understood from the following detailed description when read in connection with the accompanying drawings.

BRIEF DESCRIPTION OF THE DRAWINGS

FIG. 8 is a cross-sectional view of a structure of the first embodiment as produced in a step following that of FIG. 7;

FIG. 9 is a cross-sectional view of a structure of the first embodiment as produced in a step following that of FIG. 8;

DESCRIPTION OF THE PREFERRED EMBODIMENTS

Preferred embodiments of the present invention will now be described in detail with reference to the accompanying drawings.

First Embodiment

Figure 1:
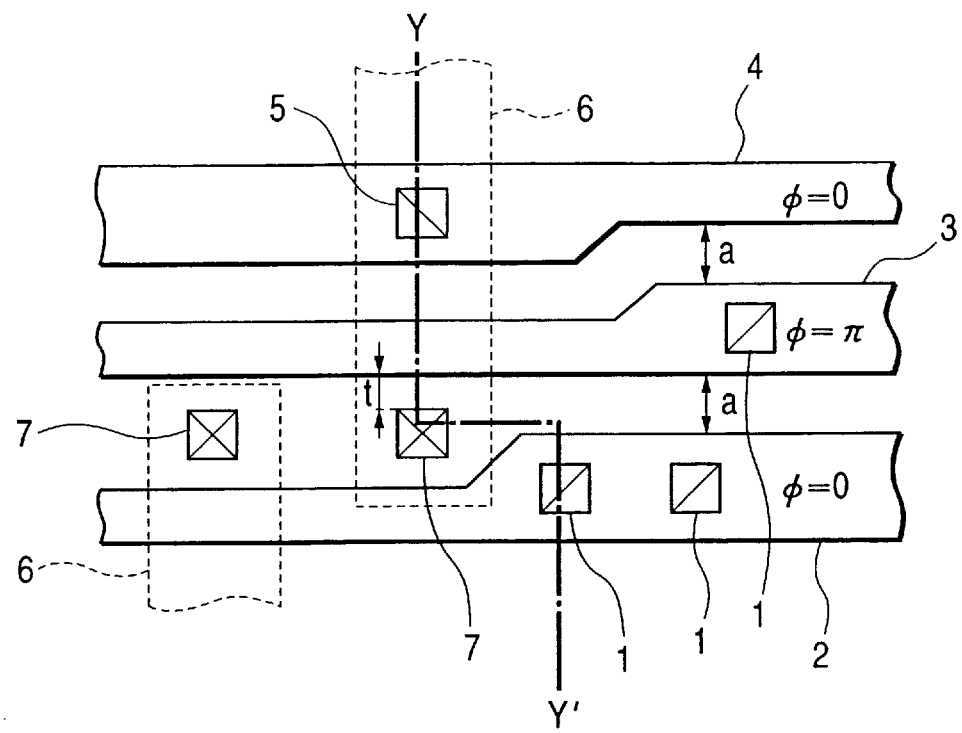
FIG. 1 is a plan view of a semiconductor integrated circuit device practiced as a first embodiment of this invention.

The basics of this invention are initially described below by referring to FIGS. 1 and 2. FIG. 1 is a plan view of a semiconductor integrated circuit device practiced as the first embodiment of this invention, and FIG. 2 is a cross-sectional view taken on line Y–Y' in FIG. 1.

In FIG. 1, wire electrodes 2, 3 and 4 are arranged to have opposite phases with respect to one another. That is, apertures of a photomask are furnished with phase shifters so that the wire electrodes 2 and 4 have a pattern phase of 0° and the wire electrodes 3 have a pattern phase of 180° (=π). It is assumed here that a minimum pattern width or a minimum pattern space as determined by the resolution of pattern transfer is defined as a minimum size "a". On that assumption, the wire electrodes 2, 3 and 4 have the minimum size "a" as the pattern space therebetween. As with the conventional example described earlier, the first embodiment is assumed to be implemented through the use of a KrF light source. That means specifically that the minimum size "a" is about 0.16 $\mu$m.

Figure 2:
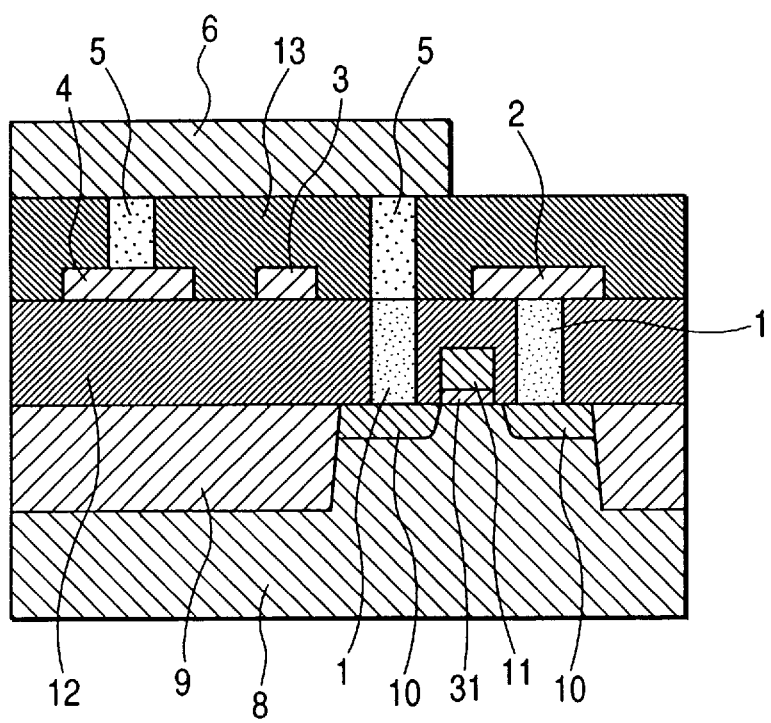
FIG. 2 is a cross-sectional view taken on line Y–Y' in FIG. 1.

As depicted in FIG. 2 (not shown in FIG. 1), a silicon substrate 8 carries on it MOSFETs including a gate oxide film 31, gate electrodes 11, high-density impurity regions 10 (source and drain regions), and an isolation oxide film 9. On the MOSFETS are a first interlayer insulating film 12, first-layer wire electrodes 2, 3 and 4; a second interlayer insulating film 13, and a second-layer wire electrode 6 stacked one upon another. The high-density impurity regions 10 and first-layer wire electrodes 2 are interconnected by plug electrodes 1 each penetrating through the interlayer insulating film 12; the first-layer wire electrodes 4 and second-layer wire electrodes 6 are interconnected by plug electrodes 5 each penetrating through the second interlayer insulating film 13.

A margin "t" is defined here as a positional margin allowing for any unevenness from fabrication of the first-layer wire electrodes 2 and 3. On the high-density impurity regions 10 between the first-layer wire electrodes 2 and 3, the plug electrodes 1 and the wire electrodes 2 and 3 are spaced apart by a distance longer than "t" and less than "a" while the plug electrodes 1 and 5 are directly connected without intervention of the first-layer wire electrodes. The plug electrode portion made of the plug electrodes 1 and 5 in direct contact is designated by reference numeral 7 in the plan view of FIG. 1. Each plug electrode 5 is connected to the second-layer wire electrode 6 formed on the second interlayer insulating film 13. The first-layer wire electrode 4 is connected to the second-layer wire electrode 6 above via the plug electrodes 5. The wire electrodes 2, also in the first layer, are connected to the high-density impurity regions 10 via the plug electrodes 1.

Figure 3:
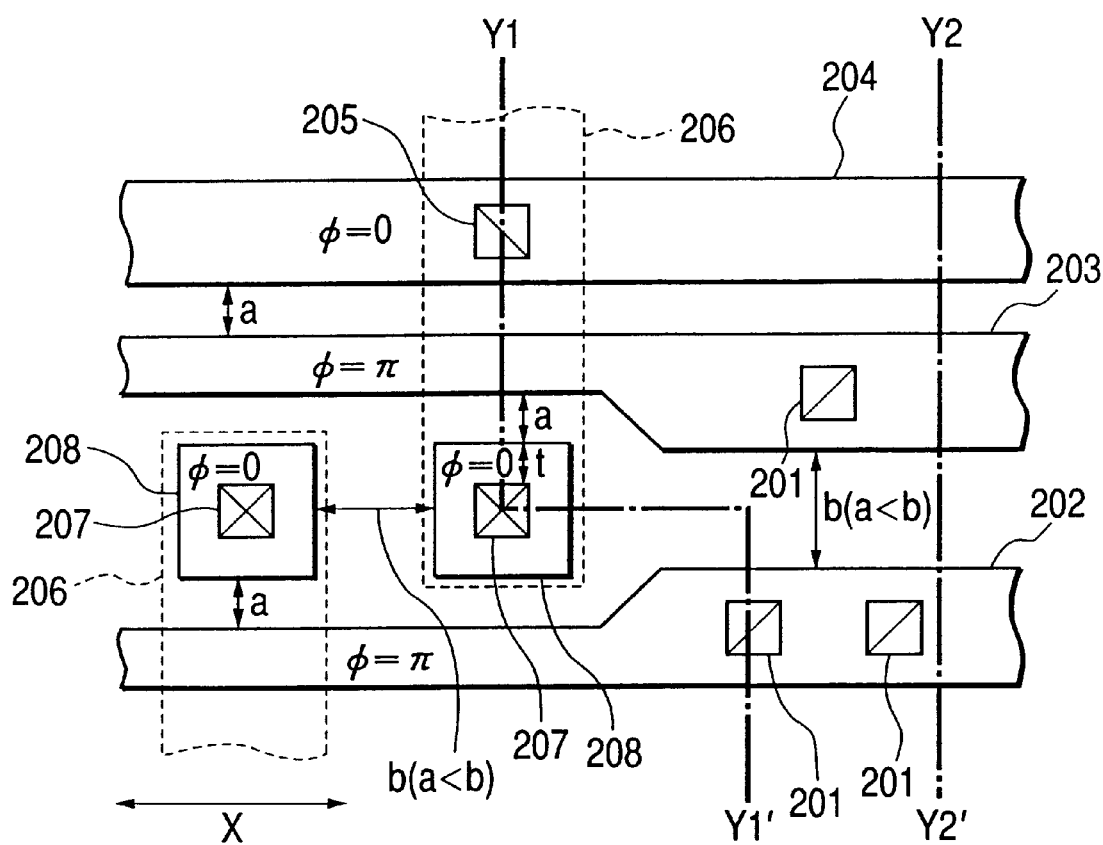
FIG. 3 is a plan view of a conventional semiconductor integrated circuit device.
Figure 5:
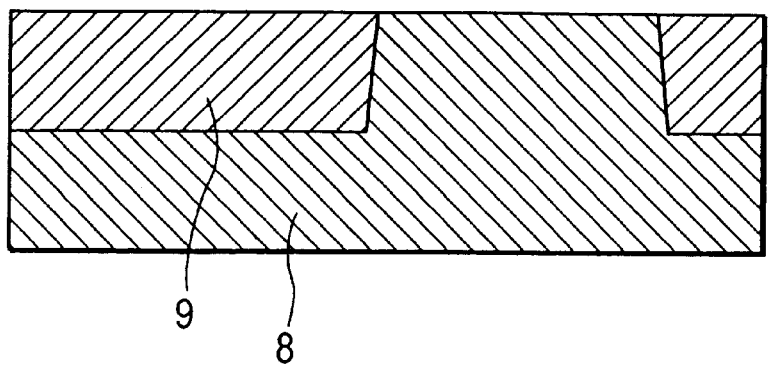
FIG. 5 is a cross-sectional view of a structure of the first embodiment in FIG. 2 as produced in one of a plurality of steps.
Figure 6:
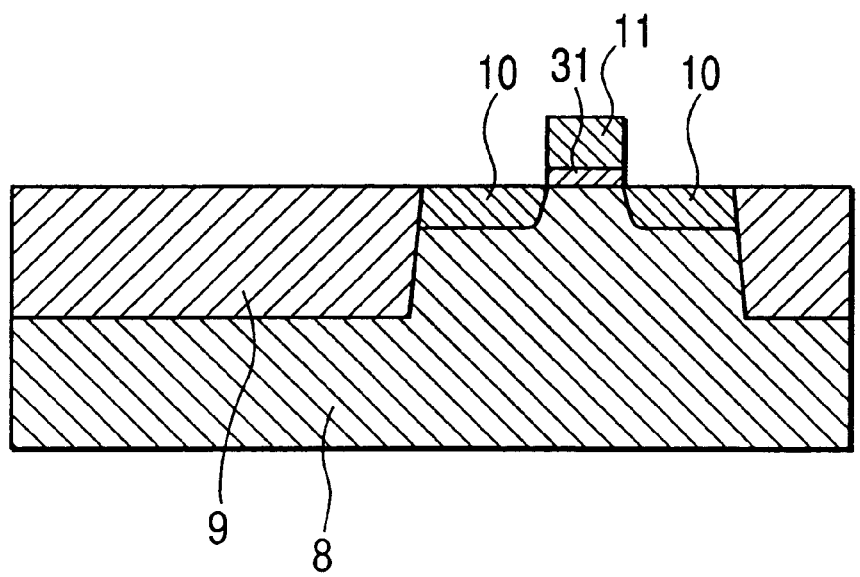
FIG. 6 is a cross-sectional view of a structure of the first embodiment as produced in a step following that of FIG. 5.

Described below in steps with reference to FIGS. 5 through 11 is a method for fabricating the semiconductor integrated circuit device whose structure is shown in FIG. 3. Referring first to FIG. 5, an isolation oxide film 9 is formed on a p-type silicon substrate 8 using shallow trench isolation. With the isolation oxide film 9 thus formed, n-channel MOSFETs are formed in active regions. The MOSFETs are each made of high-density n-type impurity regions 100 (source and drain regions), a gate oxide film 31 and a gate electrode 11 (see FIG. 6).

A silicon oxide film 12 suitable for gap implantation is then deposited. The film 12 may be deposited by any one of such methods as CVD (Chemical-Vapor-Deposition)-$SiO_2$ using ozone-TEOS (Thetra-Ethoxy-Silane), plasma CVD-$SiO_2$ based on HDP (High Density Plasma), and SOG (Spin-On-Glass) for film formation by spin coating. Additional use of CMP (Chemical-Mechanical-Polishing) is preferred for its ability to improve flatness. Thereafter, apertures 14 of substantially identical dimensions are formed in the first interlayer insulating film 12 on the high-density impurity regions 10 by photolithography and dry etching (see FIG. 7). The apertures 16 actually measured 0.2 $\mu$m in diameter each with the first embodiment.

Referring to FIG. 8, tungsten is deposited by CVD to a thickness of about 200 nm as the material for fabricating the plug electrodes 1. Tungsten portions excluding the apertures are polished by CMP. Although not illustrated, a barrier metal material such as titanium nitride (TiN) needs to be provided under the tungsten layer so that the tungsten plug electrodes 1 will react with the silicon substrate 8.

Referring now to FIG. 9, a tungsten film is deposited illustratively by sputtering to a thickness of about 100 nm, less than the minimum size "a," and patterned by photolithography and dry etching so as to form the first-layer wire electrodes 2, 3 and 4. A photomask used for pattern transfer has phase shifters arranged so that the first-layer wire electrodes 2 and 4 have a pattern phase of 0° and the wire electrodes 3 have a pattern phase of 180°. A barrier metal material such as TiN should preferably be provided under the tungsten film for fabricating the first-layer wire electrodes. The first-layer wire electrodes may also be formed using an alternative material, e.g., a composite film (so-called polycide film) made of a silicide film (high-melting-point metal such as tungsten) and a polycrystal silicon film; a high-melting-point metal such as molybdenum or niobium; or a low-resistance material such as aluminum.

Figure 7:
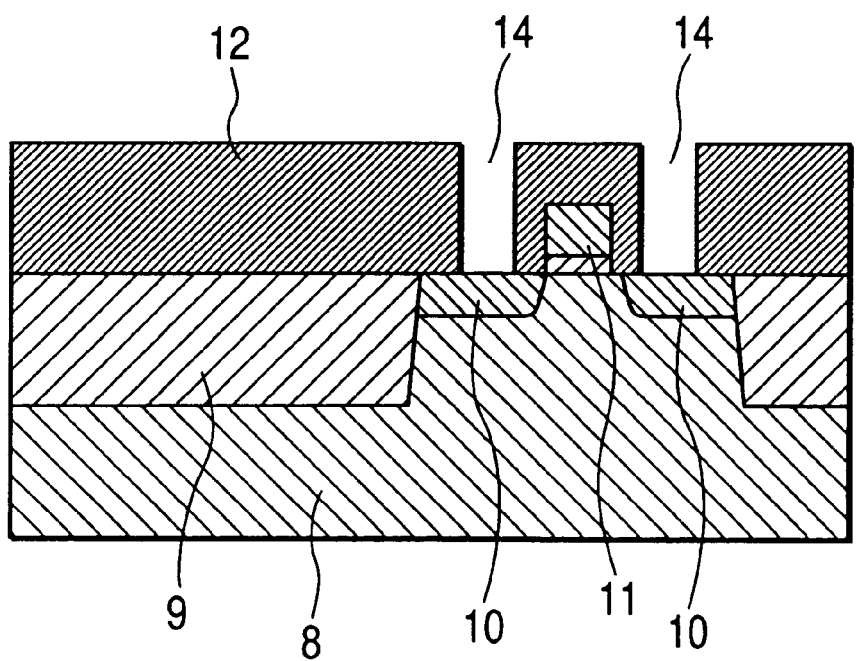
FIG. 7 is a cross-sectional view of a structure of the first embodiment as produced in a step following that of FIG. 6.
Figure 10:
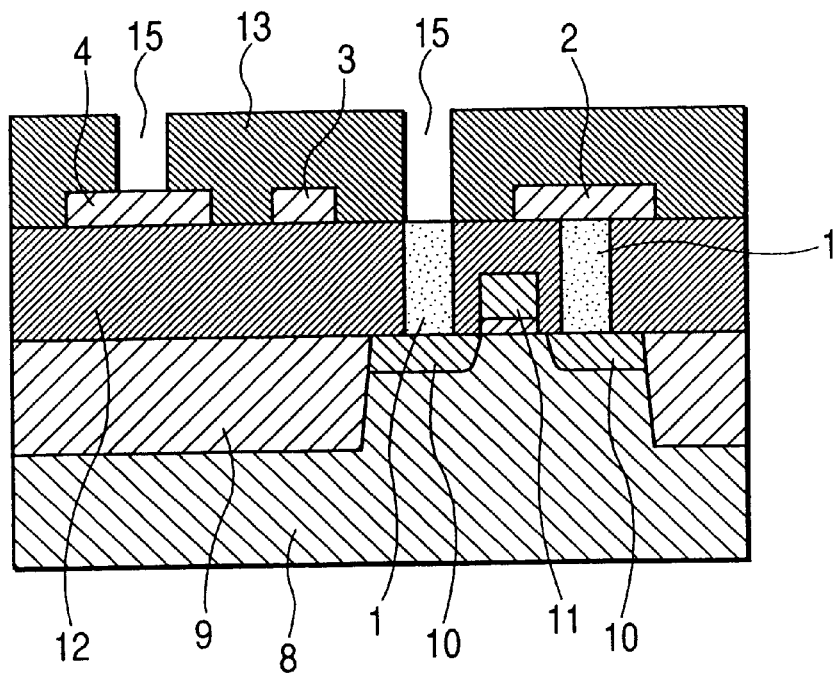
FIG. 10 is a cross-sectional view of a structure of the first embodiment as produced in a step following that of FIG. 9.

Next, an $SiO_2$ film is formed by the technique mentioned with reference to FIG. 7 in order to fabricate the second interlayer insulating film 13. Apertures 15 are made by photolithography and dry etching in the second interlayer insulating film 13 on the plug electrodes 1 and first-layer wire electrodes 4 (see FIG. 10).

Figure 11:
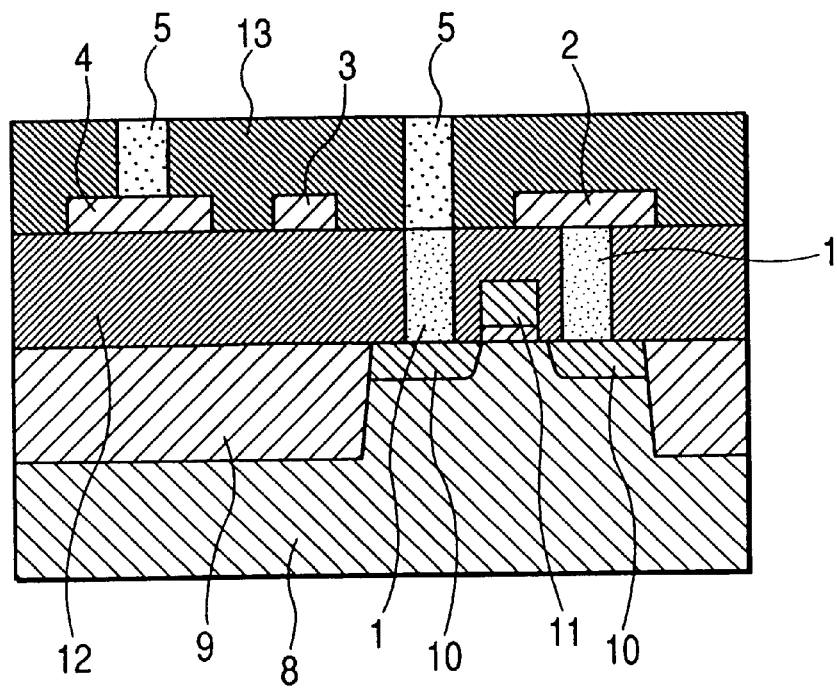
FIG. 11 is a cross-sectional view of a structure of the first embodiment as produced in a step following that of FIG. 10.

Referring to FIG. 11, tungsten plug electrodes 5 are formed by the technique discussed with reference to FIG. 9.

Lastly, an aluminum film is deposited and patterned by photolithography and dry etching to form second-layer wire electrodes 7. This completes the structure shown in FIG. 2.

Figure 12:
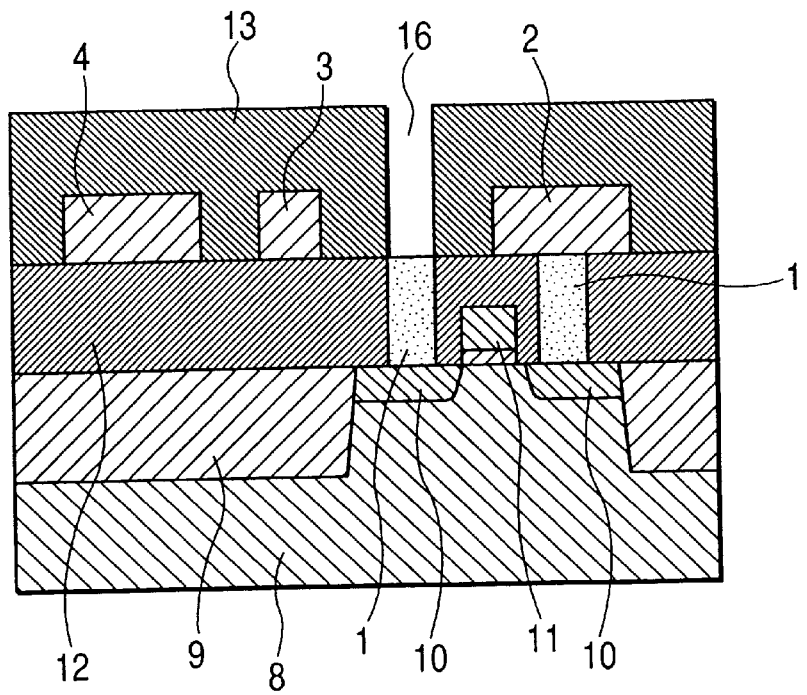
FIG. 12 is a cross-sectional view of a structure of the first embodiment in which first-layer electrode wiring is made thicker than its counterpart in the structure of FIG. 10.
Figure 13:
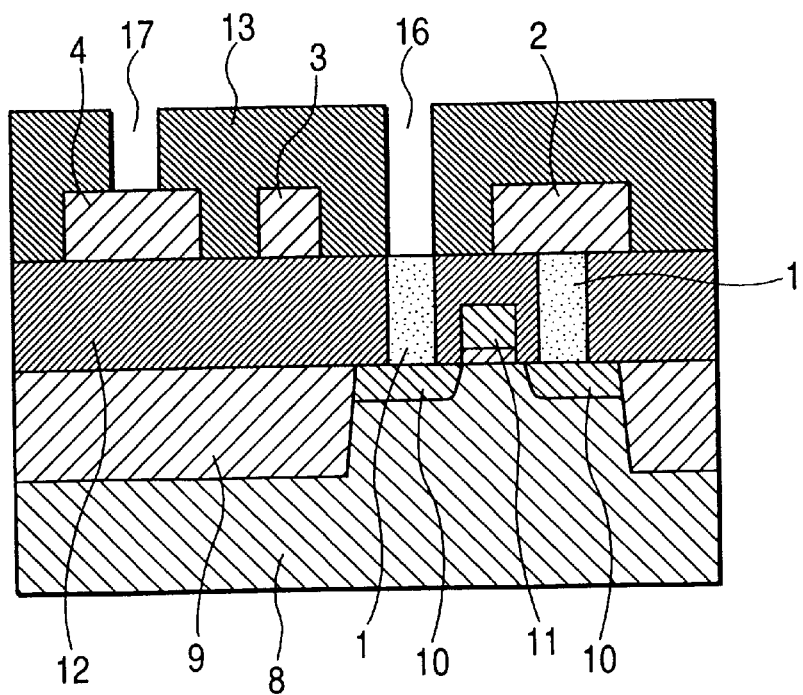
FIG. 13 is a cross-sectional view of a structure of the first embodiment as produced in a step following that of FIG. 12.

Although the first embodiment has its first-layer wire electrodes made of a film about 100 nm thick, this is not limitative of the invention. Alternatively, thicker electrode wiring may be furnished by having apertures 16 made on the plug electrodes 1 and apertures 17 formed on the wire electrodes 4 in separate steps of photolithography and dry etching, as shown in FIGS. 12 and 13.

The first embodiment has been described as having the tungsten and aluminum electrodes first deposited and then patterned. Alternatively, the so-called Damascene method may be used whereby grooves are formed by photolithography and dry etching in a previously deposited interlayer insulating film and, with an electrode material implanted, wire electrodes are formed by CMP solely in the grooves. Wire electrodes may be formed alternatively using a low-resistance material that forestalls migration such as copper in place of aluminum.

Figure 14:
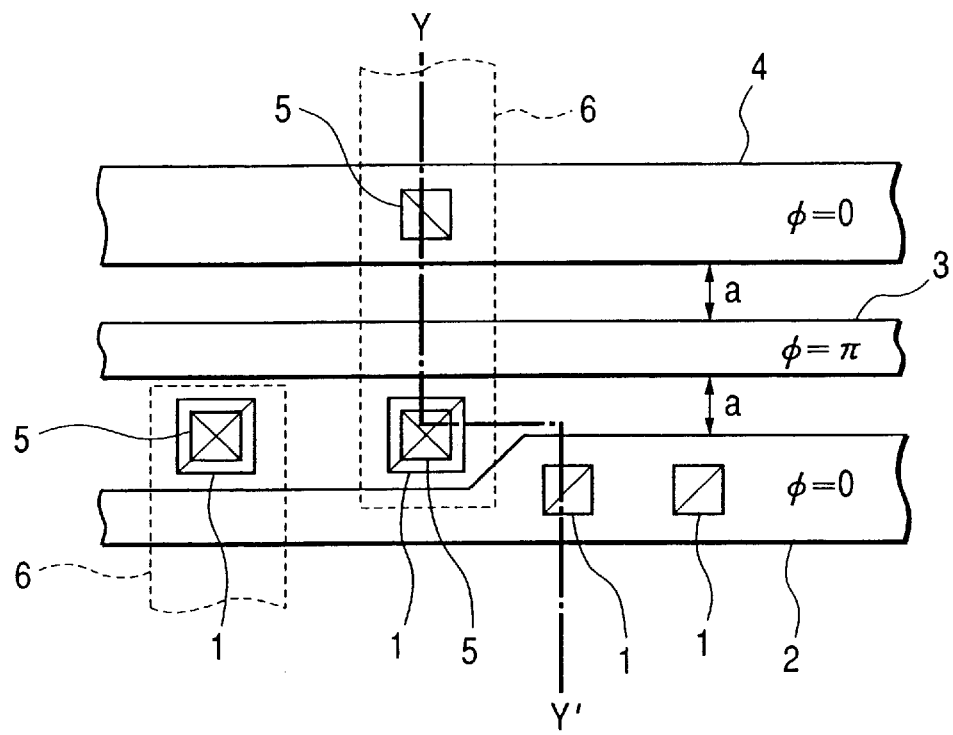
FIG. 14 is a plan view of a variation of the inventive semiconductor integrated circuit device as the first embodiment.
Figure 15:
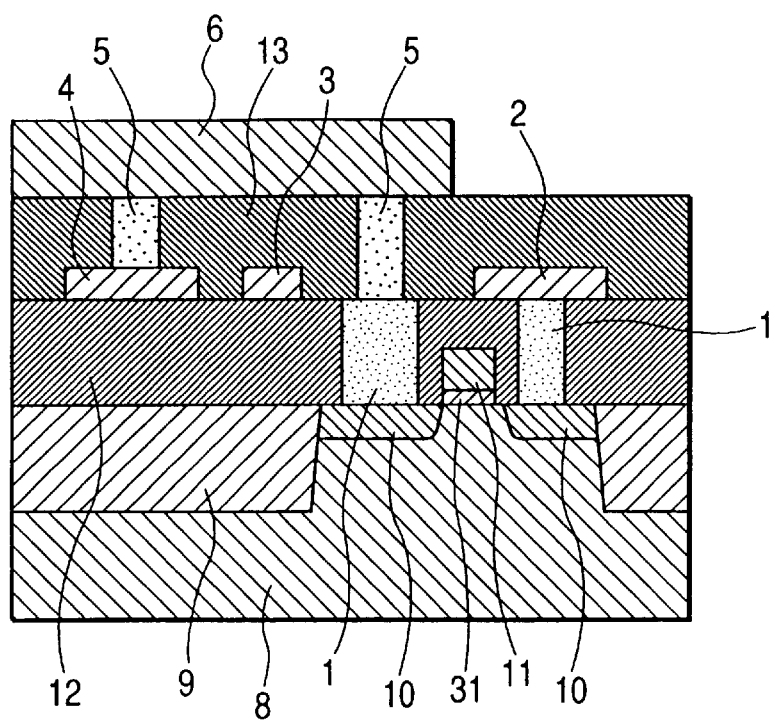
FIG. 15 is a cross-sectional view taken on line Y–Y' in FIG. 14.

As depicted in the plan view of FIG. 14 and cross-sectional view of FIG. 15, the plug electrodes 1 in a lower layer may have larger apertures than the plug electrodes 5 in an upper layer. This arrangement prevents reductions in contact area between the plug electrodes 1 and 5—reductions attributable to a misalignment between masks. FIG. 15 shows a cross-sectional view taken on line Y–Y' in the plan view of FIG. 14.

Referring again to FIG. 2, the second interlayer insulating film 13 may be formed by an insulating film having a dry etching rate higher than that of the first interlayer insulating film 12. Specifically, the first interlayer insulating film 12 may be formed by TEOS-$SiO_2$ through reaction with ozone, and the second interlayer insulating film 13 by TEOS-$SiO_2$ through reaction with ozone supplemented by about 5 mol % of phosphorus.

The first embodiment of the above structure thus provides an appreciably reduced wiring pitch in the Y–Y' direction in FIG. 1 compared with the conventional example of FIG. 3. The inventive structure makes it possible to implement a semiconductor integrated circuit device with a high degree of integration.

Second Embodiment

Figure 16:
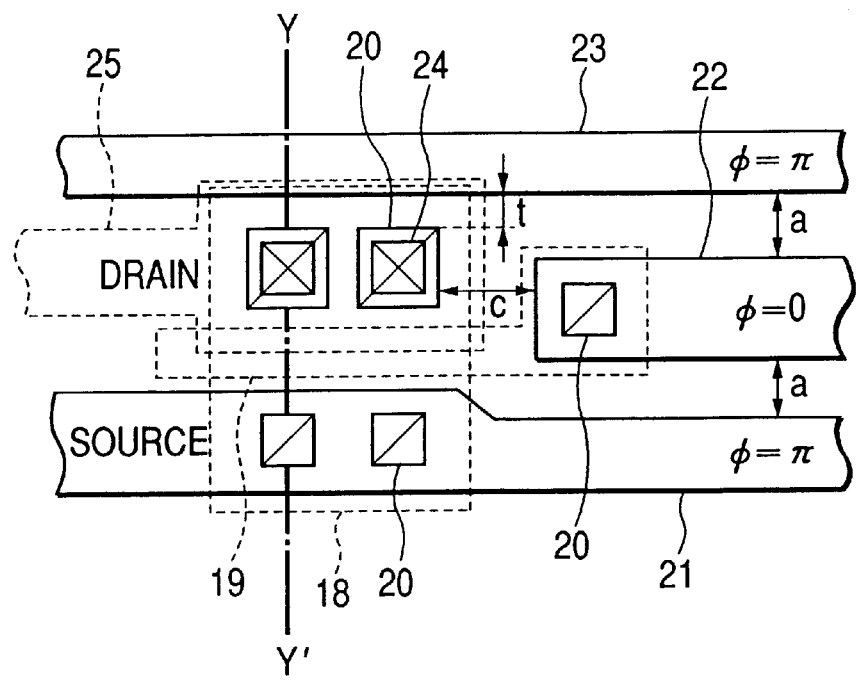
FIG. 16 is a plan view of a semiconductor integrated circuit device practiced as a second embodiment of this invention.
Figure 18:
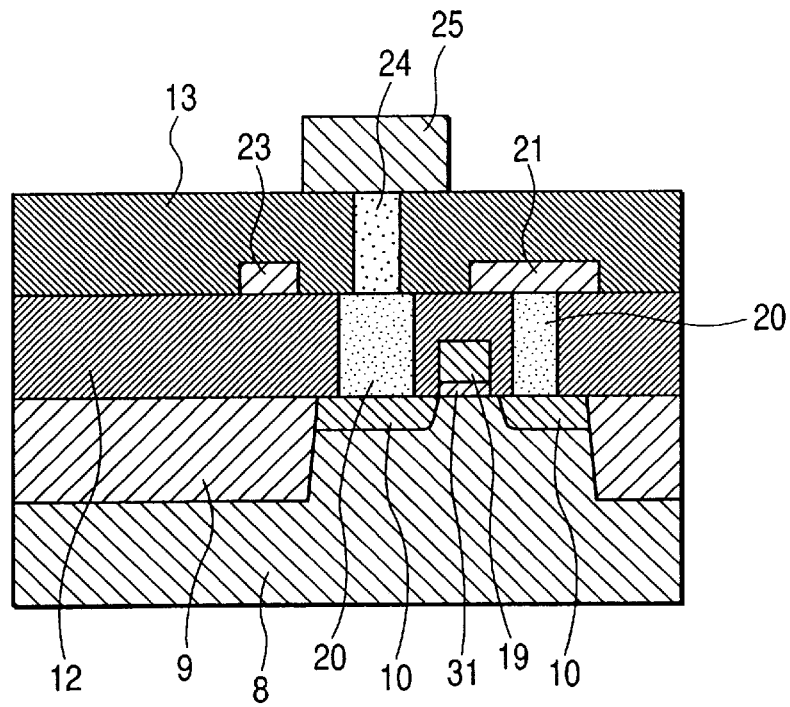
FIG. 18 is a cross-sectional view taken on line Y–Y' in FIG. 16.

FIG. 16 is a plan view of a semiconductor integrated circuit device practiced as the second embodiment of this invention, and FIG. 18 is a cross-sectional view taken on line Y–Y' in FIG. 16. The second embodiment is implemented by applying the invention to wire electrodes for supplying power to the source and drain regions of MOSFETs.

In FIGS. 16 and 18, MOSFETs are formed in active regions 18. Plug electrodes 20 are formed to penetrate through a first interlayer insulating film 12 on high-density impurity regions 10 serving as the source and drain regions of the MOSFETs. The first interlayer insulating film 12 may preferably be made of an ozone-TEOS oxide film which is suitable for gap implantation and which is flattened by CMP. The plug electrodes 20 may preferably be formed by having tungsten or titanium nitride implanted by CVD. The plug electrodes 20 formed in the high-density impurity regions 10 on the source side are connected to first-layer metal wires 21. The first-layer metal wiring may be formed by aluminum or tungsten.

The plug electrodes 20 formed in the high-density impurity regions 10 on the drain side are directly connected to plug electrodes 24 fabricated to penetrate through the second interlayer insulating film 13 on the first-layer wire electrodes. The plug electrodes 24 may be formed using the same material as that of the plug electrodes 20. The plug electrodes 20 are also connected to second-layer wire electrodes 25 on the interlayer insulating film 13. As shown in FIG. 16, gate electrodes 19 are connected at their edges to first-layer wire electrodes 22 through the plug electrodes 20. First-layer wire electrodes 23 provide wiring for adjacent transistors.

Pattern transfer is performed using a photomask comprising phase shifters such that the wire electrodes 21 and 23 have a pattern phase of 180° and the wire electrodes 22 have a pattern phase of 0°, whereby wire spacing is reduced. Between the wire electrodes 21 and 23, the upper and lower plug electrodes 20 and 24 are directly connected.

Figure 17:
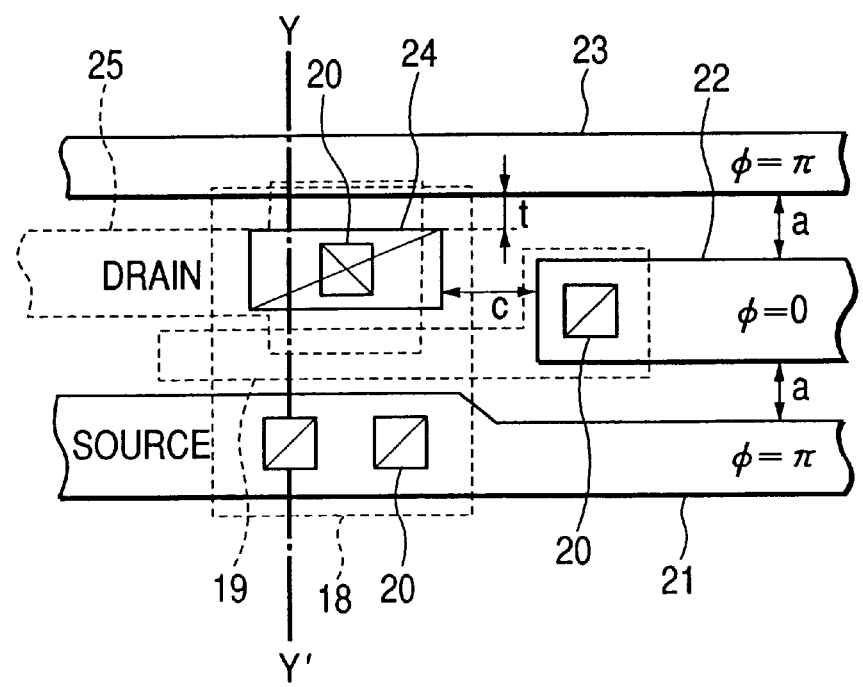
FIG. 17 is a plan view of a variation of the second embodiment.

The plug electrodes 20 in the lower layer may be rectangular in shape as depicted in FIG. 17. This enhances the degree of freedom in terms of positions at which to form the plug electrodes 24, whereby the area occupied by the MOSFETs is reduced.

Figure 4:
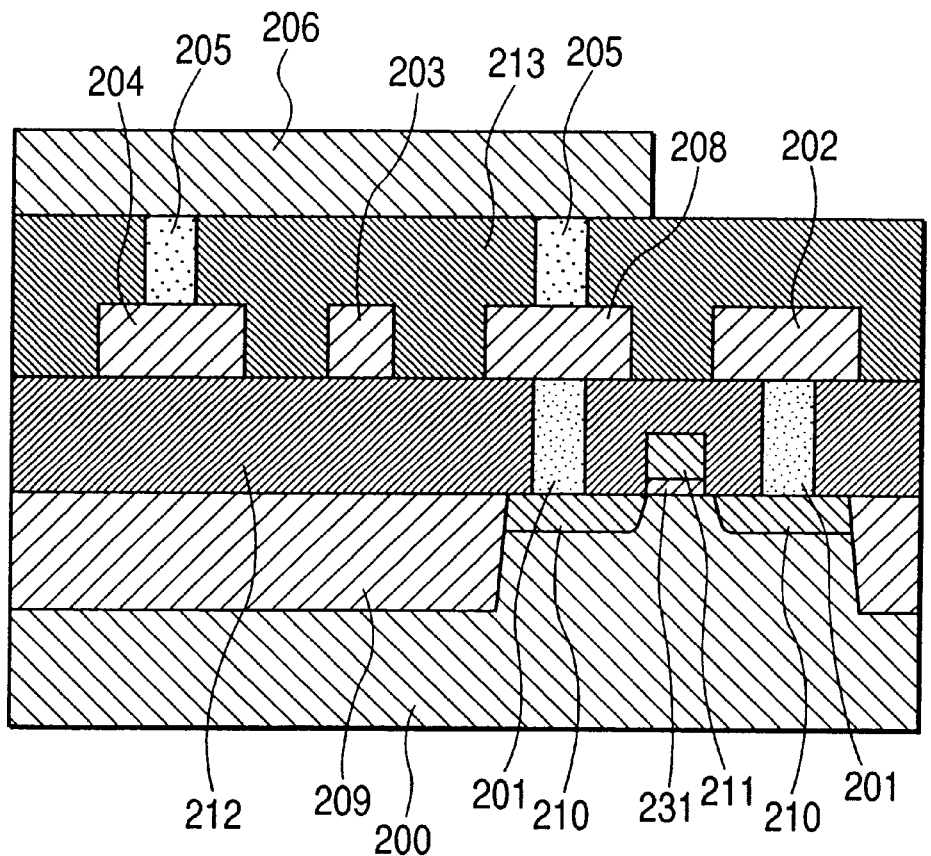
FIG. 4 is a cross-sectional view taken on line Y–Y' in FIG. 3.

Conventionally, the drain diffusion layer and the drain wire electrodes were connected using the plug electrodes 201 and 205 which in turn were connected via the insular wire electrodes 208 in the first layer, as illustrated in FIG. 4. This required a minimum of "a"+"t" as the distance between each plug electrode and the adjacent wire electrode as shown in FIG. 3. By contrast, the second embodiment has the plug electrodes 20 and 24 directly connected without intervention of insular wire electrodes in the first layer. In this structure, the distance between each plug electrode 20 and the adjacent wire electrode 23 is made less than the minimum size "a" between the first-layer wire electrodes 21, 22 and 23; a distance "c" between each plug electrode 20 and an edge of the adjacent wire electrode 22 is made as short as the distance "t."

In forming wire electrode patterns of its MOSFETs, the second embodiment of the above structure thus provides a significantly reduced distance between the gate electrodes on the one hand and the wire electrodes for the source and drain regions on the other hand, as opposed to a structure such as that of the conventional example of FIG. 4 wherein the upper and lower plug electrodes are connected to the second-layer drain wire electrodes via the first-layer insular electrodes.

Figure 29:
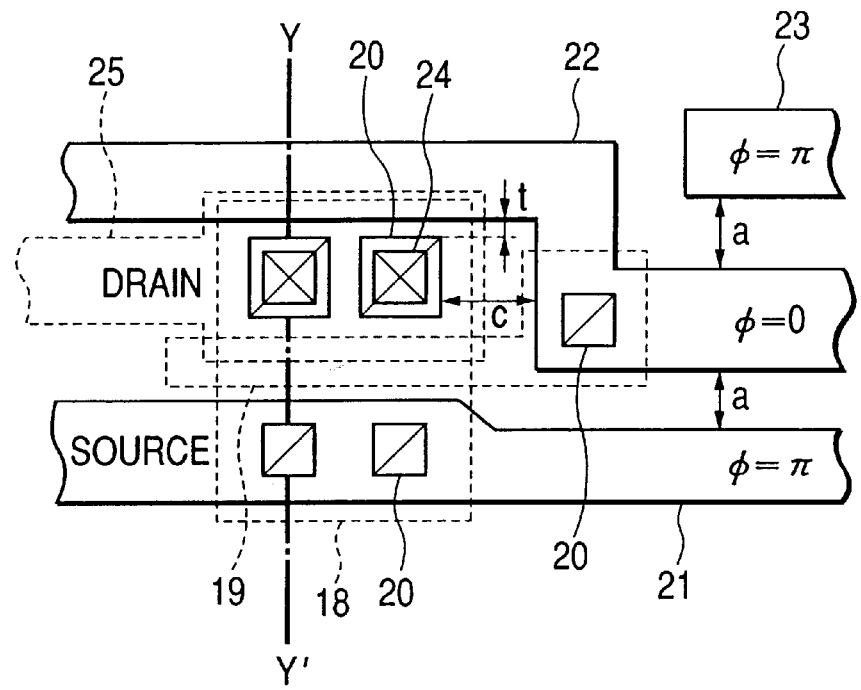
FIG. 29 is a plan view of a variation of the second embodiment as shown in FIG. 16.
Figure 30:
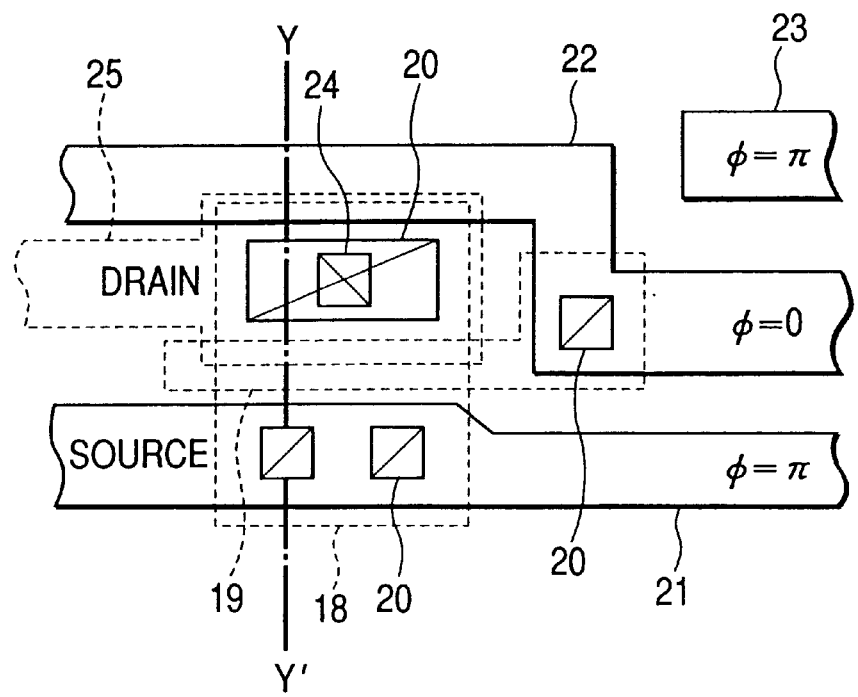
FIG. 30 is a plan view of another variation of the second embodiment as shown in FIG. 17.

FIGS. 29 and 30 show variations derived respectively from the structures in FIGS. 16 and 17. In FIGS. 29 and 30, the parts already shown in FIGS. 16 and 17 are given the same reference numerals, and their detailed descriptions are omitted. The examples of FIGS. 29 and 30 differ from those of FIGS. 16 and 17 in that the wire 23 for each adjacent transistor is truncated halfway and that the first-layer wire electrodes 22 connected to the gate electrodes 19 via the plug electrodes 20 extend close to the second-layer wire electrodes 25 serving as drain wiring. In forming such a wire electrode pattern for the MOSFETs, the plug electrodes 20 and 24 are directly connected between the wire electrodes 21 and 22 having a different phase each, without intervention of the first-layer insular wire electrodes. These alternative examples obviously offer the same effect of wire space reductions as that provided by the examples of FIGS. 16 and 17.

Third Embodiment

Figure 19:
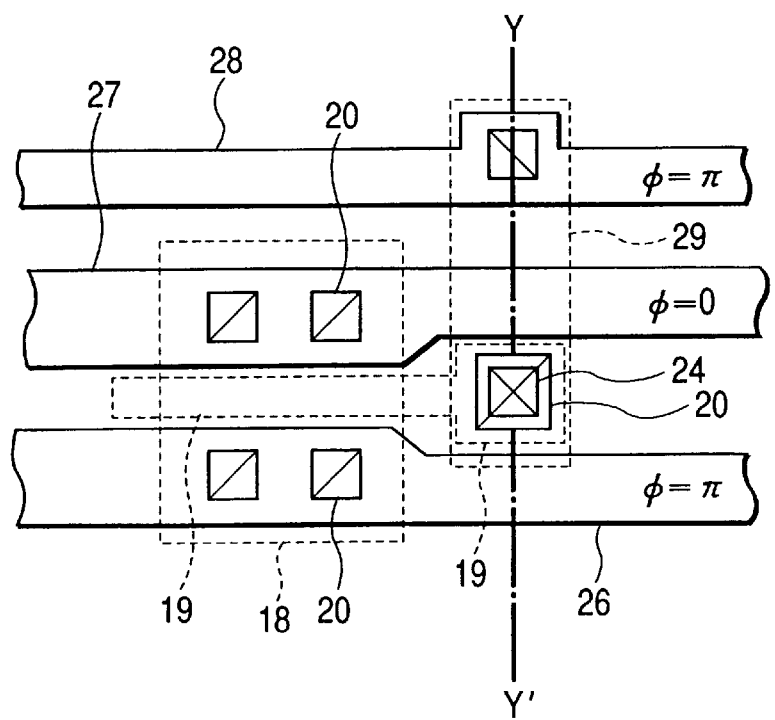
FIG. 19 is a plan view of a semiconductor integrated circuit device practiced as a third embodiment of this invention.
Figure 20:
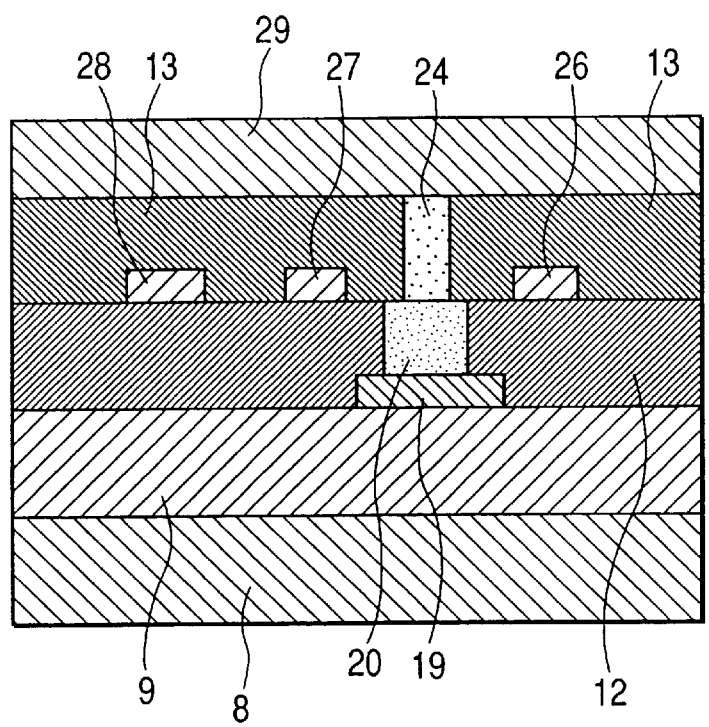
FIG. 20 is a cross-sectional view taken on line Y–Y' in FIG. 19.

FIG. 19 is a plan view of a semiconductor integrated circuit device practiced as the third embodiment of this invention, and FIG. 20 is a cross-sectional view taken on line Y–Y' in FIG. 19. The third embodiment is implemented by applying the invention to wire electrodes for supplying power to the gates of MOSFETs.

Referring to FIGS. 19 and 20, the MOSFETs are formed in active regions 18 as in the case with the second embodiment. Plug electrodes 20 formed to penetrate through a first interlayer insulating film 12 are in high-density impurity regions (not shown) serving as source and drain regions of the MOSFETs. First-layer wire electrodes 26 are connected to the plug electrodes 20 on the source side, and first-layer wire electrodes 27 are connected to the plug electrodes 20 on the drain side. First-layer wire electrodes 28 are each a wire electrode for the adjacent MOSFET. Pattern transfer is carried out by use of a photomask comprising phase shifters such that the wire electrodes 26 and 28 have a pattern phase of 180° and the wire electrodes 27 have a pattern phase of 0° whereby wire spacing is reduced.

The plug electrodes 20 are connected to an edge of each gate electrode 19. Plug electrodes 24 formed to penetrate through a second interlayer insulating film 13 (see FIG. 20) are directly connected to the plug electrodes 20. The plug electrodes 24 are connected to second-layer wire electrodes 29 on the second interlayer insulating film 13.

In forming wire electrode patterns of its MOSFETs, the third embodiment of the above structure thus provides a significantly reduced distance between the wire electrodes connected to the source and drain regions.

Fourth Embodiment

Figure 21:
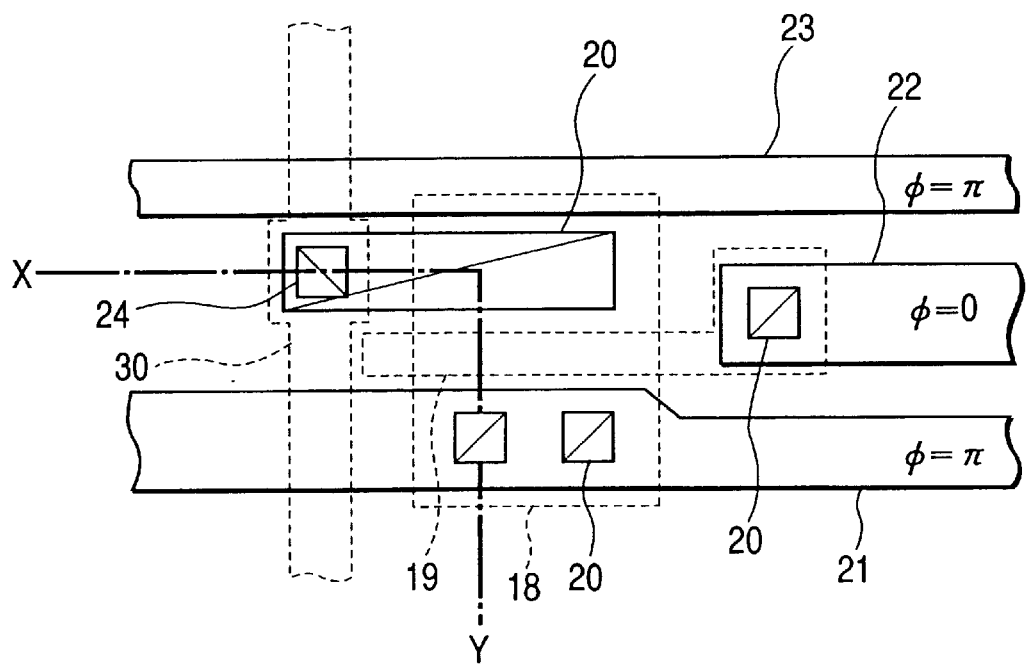
FIG. 21 is a plan view of a semiconductor integrated circuit device practiced as a fourth embodiment of this invention.
Figure 22:
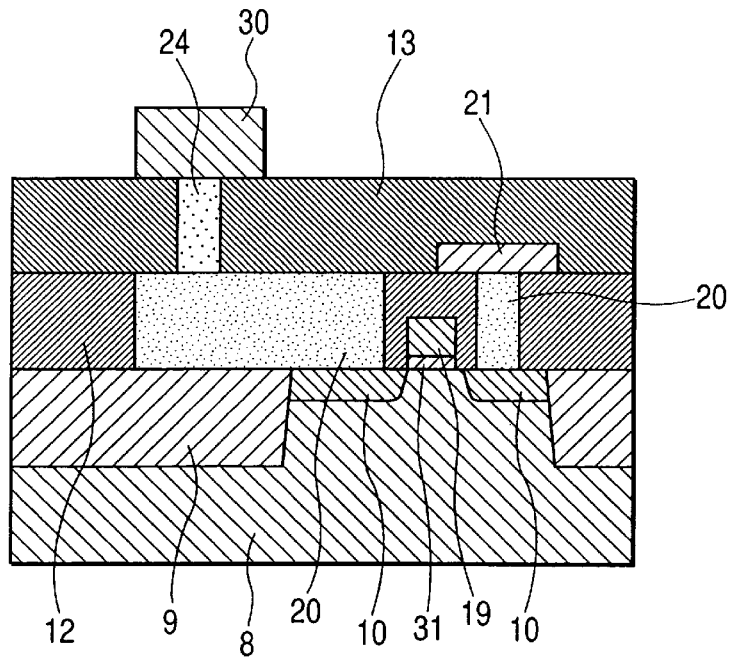
FIG. 22 is a cross-sectional view taken on line X-Y in FIG. 21.

FIG. 21 is a plan view of a semiconductor integrated circuit device practiced as the fourth embodiment of this invention, and FIG. 22 is a cross-sectional view taken on line X-Y in FIG. 21. The fourth embodiment relates to wire electrodes for supplying power to the gates of MOSFETs. As such, the fourth embodiment is an improvement over the second embodiment with steps to form wire electrodes connected to drain regions.

As in the case with the second embodiment, the fourth embodiment has its MOSFETs formed in active regions 18 as shown in FIGS. 21 and 22. On the high-density impurity regions 10 serving as the source and drain regions of the MOSFETs are plug electrodes 20 formed to penetrate through a first interlayer insulating film 12. The plug electrodes 20 fabricated in the high-density impurity regions 10 on the source side are connected to first-layer wire electrodes 21 extending in the X direction. The plug electrodes 20 formed on the drain side are rectangular in shape and extend outside the active regions 18. Plug electrodes 24 formed to penetrate through a second interlayer insulating film 13 are directly connected to the plug electrodes 20 outside the active regions 18. The plug electrodes 24 are also connected to second-layer wire electrodes 30 extending in the Y direction on the second interlayer insulating film 13.

Gate electrodes 19 are connected at their edges to first-layer wire electrodes 22 via the plug electrodes 20. First-layer wire electrodes 23 provide wiring for adjacent transistors.

Pattern transfer is performed using a photomask comprising phase shifters such that the wire electrodes 21 and 23 have a pattern phase of 180° and the wire electrodes 22 have a pattern phase of 0°, whereby wire spacing is reduced. Between the wire electrodes 21 and 23, the upper and lower plug electrodes 20 and 24 are directly connected.

In forming wire electrode patterns of its MOSFETs, the fourth embodiment of the above structure thus provides a significantly reduced distance between the gate electrodes on the one hand and the wire electrodes for the source and drain regions on the other hand.

When the rectangular plug electrodes 20 described above are arranged to extend onto an isolation oxide film 9 outside the active regions 18, a silicon nitride film should preferably be used as a stopper film for dry etching of contact apertures. The arrangement will prevent scraping of the isolation oxide film 9.

Fifth Embodiment

Figure 23:
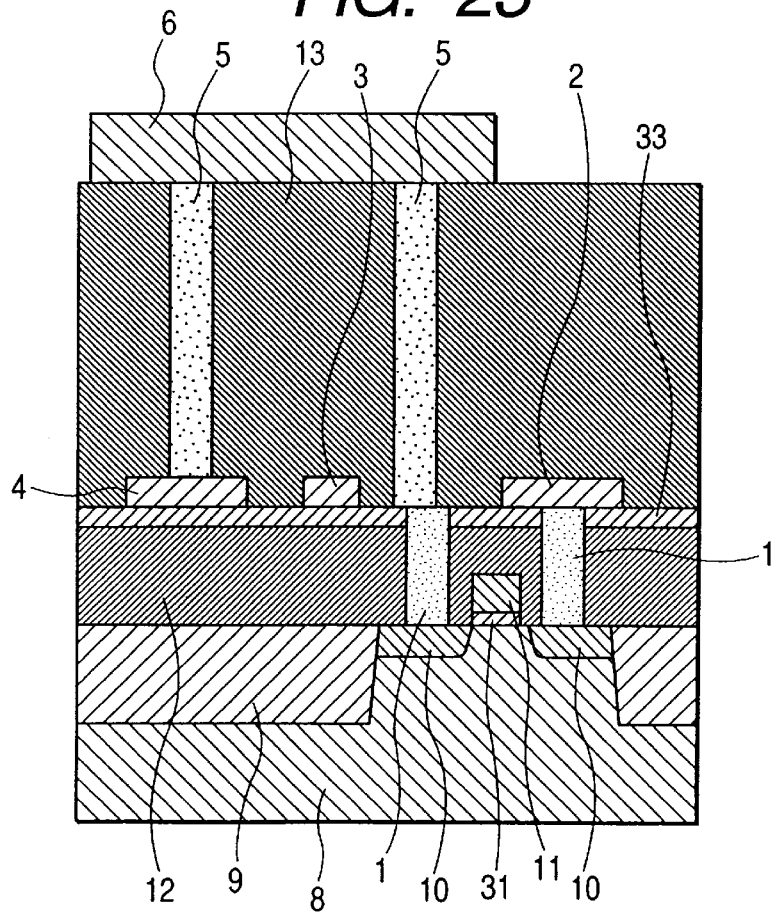
FIG. 23 is a cross-sectional view of a semiconductor integrated circuit device practiced as a fifth embodiment of this invention.

FIG. 23 is a cross-sectional view of a semiconductor integrated circuit device practiced as the fifth embodiment of this invention. A plan view of the fifth embodiment is identical to FIG. 1 of the first embodiment and thus will not be shown. The cross-sectional view of FIG. 23 corresponds to one taken on line Y–Y' in FIG. 1. The fifth embodiment relates to a technique for fabricating plug electrodes.

Referring to FIG. 23, where an upper and lower plug electrodes 1 and 5 are directly connected on a one-to-one basis, an etching stopper film 33 is deposited over a first interlayer insulating film 12. The stopper film 33 is provided to prevent the first interlayer insulating film 12 from being inordinately scraped during a dry etching process to fabricate the plug electrodes 5. Without a stopper film, such scraping can occur if the upper and lower plug electrodes 1 and 5 are not completely aligned due to a misalignment between masks. The etching stopper film 33 may be formed by a silicon nitride film, while the first and second interlayer insulating films 12 and 13 may be formed by a silicon oxide film each.

The fifth embodiment prevents geometrical deterioration of the plug electrodes 5 as they are implanted. This helps prevent a decline in the yield rate of semiconductor integrated circuit devices.

Figure 24:
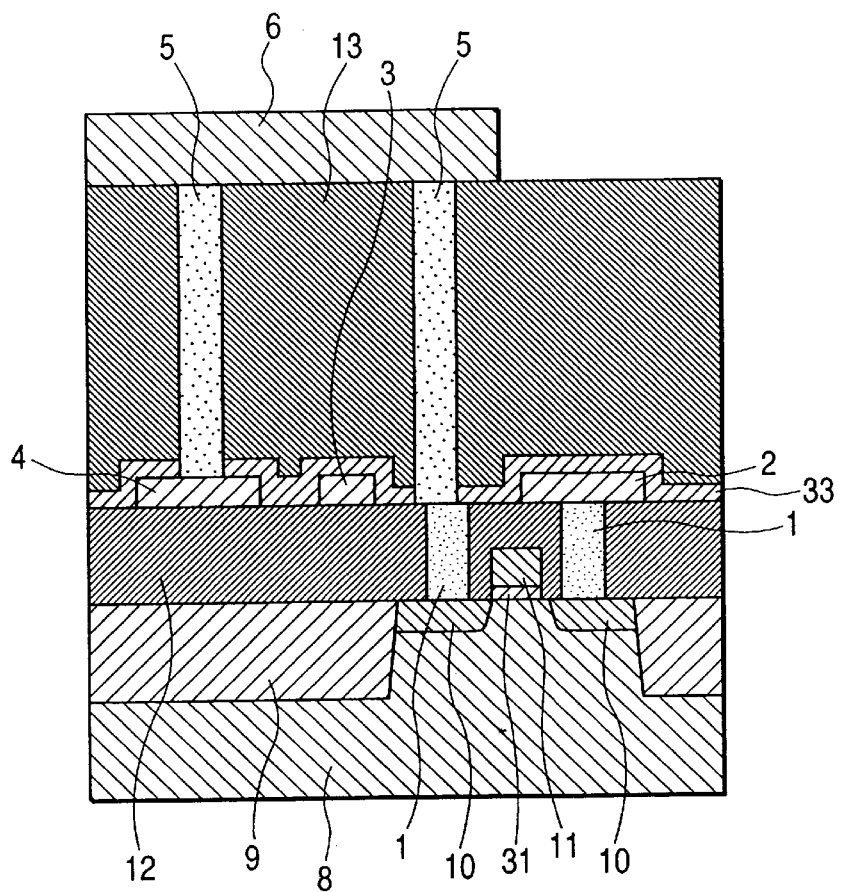
FIG. 24 is a cross-sectional view of a variation of the fifth embodiment.

With the fifth embodiment, the etching stopper film 33 is furnished under the first-layer wire electrodes 2, 3 and 4. Alternatively, the stopper film may be deposited on the first-layer wire electrodes 2, 3 and 4 as illustrated in FIG. 24.

Figure 25:
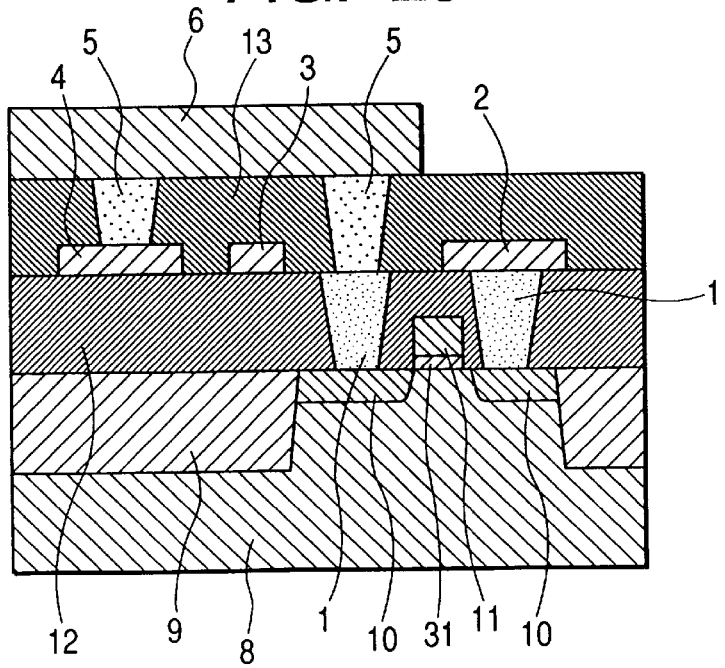
FIG. 25 is a cross-sectional view of another variation of the fifth embodiment.

As another alternative, the upper and lower plug electrodes 1 and 5 may be tapered as depicted in FIG. 25. Tapering of the plug electrodes 1 and 5 is achieved when contact holes for fabricating the electrodes are etched under dry etching conditions designed to ensure a cone angle. Where the plug electrodes 1 and 5 are tapered, the upper plug electrode 5 is not dislodged from the lower plug electrode 1 in case of a misalignment between masks.

Sixth Embodiment

Figure 26:
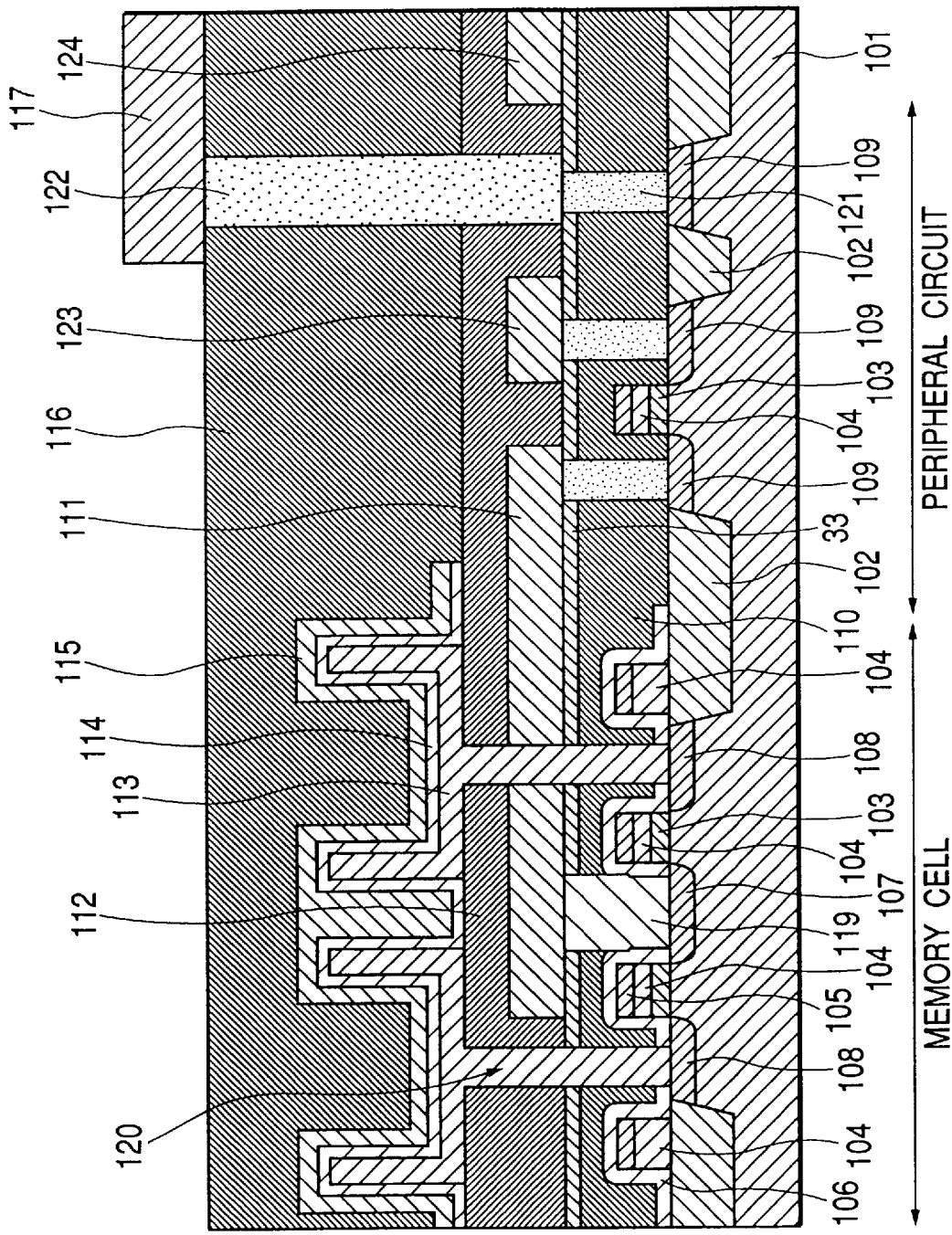
FIG. 26 is a cross-sectional view of a semiconductor integrated circuit device practiced as a sixth embodiment of this invention.
Figure 27:
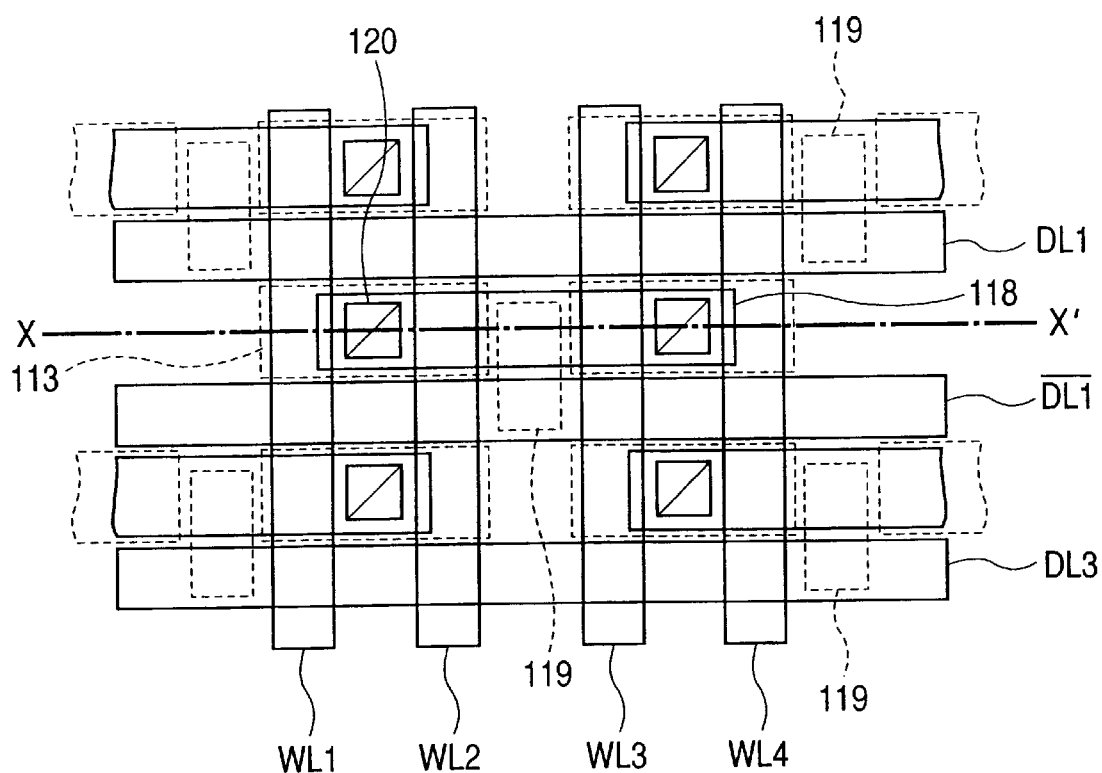
FIG. 27 is a plan view of the sixth embodiment in FIG. 26.

FIG. 26 is a cross-sectional view of a semiconductor integrated circuit device practiced as the sixth embodiment of this invention. The sixth embodiment is implemented by applying the invention to peripheral circuits of a DRAM (Dynamic Random Access Memory). The cross-sectional view of FIG. 26 is taken on line X–X' in the plan view of FIG. 27 showing a DRAM memory cell. As such, FIG. 26 shows a partial cross section of a peripheral circuit adjacent to a memory cell of the DRAM.

Referring to FIG. 27, the memory cell layout is the same as a conventional layout such as is described in Japanese Published Unexamined Patent Application No. Hei 3-174766. In FIG. 27, word lines WL1 through WL4 are provided in the Y direction while data lines DL1, /DL1 and DL3 are furnished in the X direction. The word lines WL1 through WL4 constitute gate electrodes 104 (see FIG. 26) common to an MISFET in the memory cell. The symbol "/" signifies "inverse."

Wire electrodes 111 (see FIG. 26) making up the data lines DL1, /DL1 and DL3 are connected to active regions 118 (high-density n-type impurity regions 107 in FIG. 26) of the MISFET via plug electrodes 119 made of polycrystal silicon.

Memory capacitor storage electrodes 113 are furnished on the word lines WL1 through WL4 as well as on the data lines DL1, /DL1 and DL3. The storage electrodes 113 are covered with a capacitor insulating film 114 which in turn is topped with a plate electrode 115. In practice, the inventors used a 50 nm-thick polycrystal silicon film highly doped with phosphorus to fabricate the capacitor storage electrodes 113, employed a 10 nm-thick tantalum pentoxide ($Ta_2O_5$) to form the capacitor insulating film 114, and utilized a 100 nm-thick titanium nitride film to produce the upper plate electrode 115.

In FIG. 26, the wire electrodes 111 and capacitor storage electrodes 113 are shown in the same cross section for purpose of simplification and illustration. Reference numeral 120 denotes through electrodes connecting the capacitor storage electrodes 113 to high-density n-type impurity regions 108. Although not shown in FIG. 26, the plate electrode 115 is fixed to a predetermined potential outside the memory cell. First-layer wire electrodes 123 of the peripheral circuit portion are connected to high-density n-type impurity regions 109 (source or drain regions) of the MISFETs in the peripheral circuit portion. Wire electrodes 124 are covered with second-layer wire electrodes 117.

Also in FIG. 26, the wire electrodes 111 constituting the data lines DL1, /DL1 and DL3 are made of a high-melting-point metal such as tungsten, about 50 nm thick, and a reaction stopper film such as a titanium nitride film about 20 nm thick deposited under the high-melting-point metal. The wire electrodes Ill extend throughout the peripheral circuit portion and are located in the same layer as the first-layer wire electrodes 123 and 124. The first-layer wire electrodes 123 and 124 of high wiring density are formed in the peripheral circuit portion by pattern transfer using a photomask comprising phase shifters such that the wire electrodes 123 have a phase pattern of 0° and the wire electrodes 124 have a phase pattern of 180°.

The high-density n-type impurity regions 109 and the second-layer wire electrodes 117 are interconnected via plug electrodes 121 and 122 made of a high-melting-point metal such as tungsten. The plug electrodes 121 and 122 are formed to penetrate through a first interlayer insulating film 110, the etching stopper film 33, a second interlayer insulating film 112, and a third interlayer insulating film 116.

With the sixth embodiment, the plug electrodes 121 and 122 are directly interconnected without intervention of conventional insular electrodes. This eliminates any inconsistency in the Levenson arrangement of phase shifters, making it possible to form fine line patterns of high resolution.

In FIG. 26, reference numeral 101 stands for a silicon substrate, 102 for an isolation oxide film, and 103 for a gate insulating film. Reference numerals 105 and 105 denote etching stopper insulating films.

Figure 28:
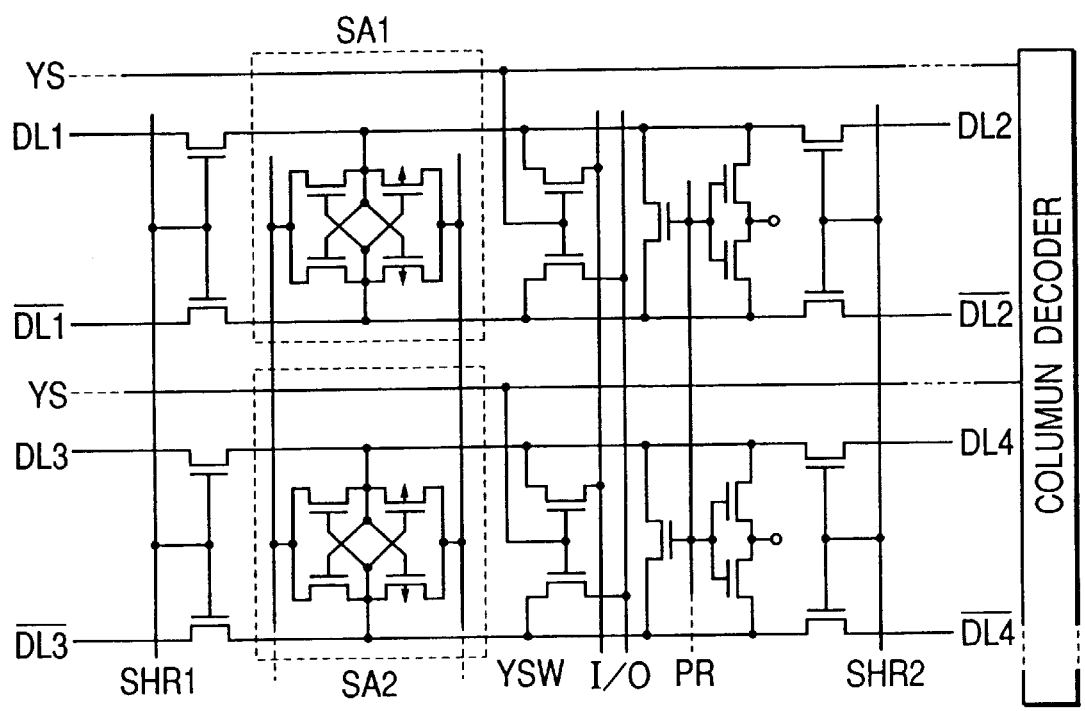
FIG. 28 is an equivalent circuit diagram of the semiconductor integrated circuit device in FIG. 27.

With the sixth embodiment, as shown in the equivalent circuit diagram of FIG. 28, the first-layer wire electrodes 123 and 124 (see FIG. 26) are used in sense amplifier circuits SA1 and SA2 to which paired data lines of the memory cell are connected. In FIG. 28, reference character PR stands for a precharging line, reference characters I/O and YSW denote column selection gates, and reference characters SHR1 and SHR2 represent paired data line changeover switches.

The sixth embodiment of the above structure reduces the area occupied by the peripheral circuits of a DRAM, particularly by sense amplifier circuits thereof. This helps implement a DRAM having a small chip area.

As described above in terms of specific embodiments, the invention provides a semiconductor integrated circuit device offering specifically an enhanced pattern density of wire electrodes and hence an advanced degree of integration.

Although the description above contains many specificities, these should not be construed as limiting the scope of the invention but as merely providing illustrations of the presently preferred embodiments of this invention. For example, the invention may also be applied to what is known as the on-chip LSI (logic-mounted memory) comprising a plurality of LSIs such as logic circuits. An on-chip LSI embodying the invention offers higher functions and further improved performance than before.

With that and other alternatives, modifications and variations of the invention becoming apparent to those skilled in the art in light of the foregoing description, the scope of the invention should be determined by the appended claims and their legal equivalents, rather than by the examples given.

What is claimed is:

1. A semiconductor integrated circuit device comprising:
    a first insulating film;
    a first conductor penetrating through said first insulating film;
    first and second wire electrodes patterned on said first insulating film in the same step using a phase-shifting mask;
    a second insulating film on said first and said second wire electrodes; and
    a second conductor penetrating through said second insulating film;
    wherein said first conductor electrically connects at least either said first or said second wire electrodes to either circuit elements or circuit wires located under said first insulating film;
    wherein said second conductor electrically connects either said first or said second wire electrodes to either circuit elements or circuit wires located on said second insulating film; and
    wherein, between adjacent first and second wire electrodes, a conductor formed with said first and said second conductor in direct contact is spaced from at least one of said adjacent first and second wire electrodes by a distance less than a minimum distance between said first and said second wire electrodes.

2. A semiconductor integrated circuit device according to claim 1, wherein said adjacent first and second wire electrodes are patterned using mask patterns having opposite phases; and
    wherein said conductor formed with said first and said second conductor in direct contact electrically connects either said circuit elements or said circuit wires located under said first insulating film, to either said circuit elements or said circuit wires located on said second insulating film.

3. A semiconductor integrated circuit device according to claim 2, wherein said adjacent first and second wire electrodes are electrically connected to a data line pair of a dynamic RAM.

4. A semiconductor integrated circuit device according to claim 1, wherein said adjacent first and second wire electrodes are patterned using mask patterns in phase with each other;
    wherein one end of said conductor made with said first and said second conductor in direct contact is connected to a drain diffusion layer of a field effect transistor under said first insulating film and the other end of said conductor is connected to a drain wire electrode on said second insulating film; and
    wherein one of said adjacent first and second wire electrodes is a source wire electrode of said field effect transistor and the other one of said adjacent first and second wire electrodes is a wire electrode of another field effect transistor adjacent to said field effect transistor.

5. A semiconductor integrated circuit device according to claim 1, wherein apertures penetrating through said first insulating film constituting said first conductor are each greater in diameter than apertures penetrating through said second insulating film constituting the second conductor.

6. A semiconductor integrated circuit device according to claim 5, wherein said adjacent first and second wire electrodes are patterned using mask patterns having opposite phases; and
    wherein said conductor formed with said first and said second conductor in direct contact electrically connects either said circuit elements or said circuit wires located under said first insulating film, to either said circuit elements or said circuit wires located on said second insulating film.

7. A semiconductor integrated circuit device according to claim 6, wherein said adjacent first and second wire electrodes are electrically connected to a data line pair of a dynamic RAM.

8. A semiconductor integrated circuit device according to claim 5, wherein said adjacent first and second wire electrodes are patterned using mask patterns in phase with each other;
    wherein one end of said conductor made with said first and said second conductor in direct contact is connected to a drain diffusion layer of a field effect transistor under said first insulating film and the other end of said conductor is connected to a drain wire electrode on said second insulating film; and
    wherein one of said adjacent first and second wire electrodes is a source wire electrode of said field effect transistor and the other one of said adjacent first and second wire electrodes is a wire electrode of another field effect transistor adjacent to said field effect transistor.

9. A semiconductor integrated circuit device according to claim 1, wherein apertures penetrating through said first and said second insulating film constituting said first and said second conductor are tapered in shape, upper portions of said apertures being made progressively wider than lower portions thereof.

10. A semiconductor integrated circuit device according to claim 9, wherein said adjacent first and second wire electrodes are patterned using mask patterns having opposite phases; and wherein said conductor formed with said first and said second conductor in direct contact electrically connects either said circuit elements or said circuit wires located under said first insulating film, to either said circuit elements or said circuit wires located on said second insulating film.

11. A semiconductor integrated circuit device according to claim 10, wherein said adjacent first and second wire electrodes are electrically connected to a data line pair of a dynamic RAM.

12. A semiconductor integrated circuit device according to claim 9, wherein said adjacent first and second wire electrodes are patterned using mask patterns in phase with each other;

wherein one end of said conductor made with said first and said second conductor in direct contact is connected to a drain diffusion layer of a field effect transistor under said first insulating film and the other end of said conductor is connected to a drain wire electrode on said second insulating film; and wherein one of said adjacent first and second wire electrodes is a source wire electrode of said field effect transistor and the other one of said adjacent first and second wire electrodes is a wire electrode of another field effect transistor adjacent to said field effect transistor.

* * * * *